(12) United States Patent
Tsuda

(10) Patent No.: US 7,490,959 B2
(45) Date of Patent: Feb. 17, 2009

(54) LIGHT EMITTING APPARATUS, BACKLIGHT APPARATUS, AND ELECTRONIC APPARATUS

(75) Inventor: Yoichi Tsuda, Mihara (JP)

(73) Assignee: Sharp Kabushiki Kaisha, Osaka (JP)

(*) Notice: Subject to any disclaimer, the term of this patent is extended or adjusted under 35 U.S.C. 154(b) by 119 days.

(21) Appl. No.: 11/639,806

(22) Filed: Dec. 14, 2006

(65) Prior Publication Data

US 2007/0139908 A1 Jun. 21, 2007

(30) Foreign Application Priority Data

Dec. 16, 2005 (JP) ............................. 2005-363886

(51) Int. Cl.
*F21V 7/00* (2006.01)
(52) U.S. Cl. .................... 362/267; 362/310; 257/99; 257/100
(58) Field of Classification Search .................. None
See application file for complete search history.

(56) References Cited

U.S. PATENT DOCUMENTS

| | | | |
|---|---|---|---|
| 6,874,910 B2 * | 4/2005 | Sugimoto et al. | 362/294 |
| 7,070,304 B2 * | 7/2006 | Imai | 362/267 |
| 7,238,967 B2 * | 7/2007 | Kuwabara et al. | 257/98 |

FOREIGN PATENT DOCUMENTS

JP 2003-249689 A 9/2003

\* cited by examiner

*Primary Examiner*—Thomas M Sember
(74) *Attorney, Agent, or Firm*—Morrison & Foerster LLP

(57) ABSTRACT

A light emitting apparatus according to the present invention includes: a placement surface that includes an electrode; a light emitter that is placed on the placement surface; and a transparent sealing resin that seals the light emitter, and forms a concave surface that is a light-outgoing surface via which light outgoes. The concave surface faces a surface of the light emitter, from which surface light is emitted. The light emitter and the electrode are connected via a wire that is curved in such a way that a top section of the curved wire substantially coincides with a deepest section of the concave surface.

18 Claims, 7 Drawing Sheets

CROSS SECTION A-A'

CROSS SECTION B-B'

CROSS SECTION A-A'

LIGHT EMITTING APPARATUS, BACKLIGHT APPARATUS, AND ELECTRONIC APPARATUS

This Nonprovisional application claims priority under 35 U.S.C. § 119(a) on Patent Application No. 363886/2005 filed in Japan on Dec. 16, 2005, the entire contents of which are hereby incorporated by reference.

FIELD OF THE INVENTION

The present invention relates to a light emitting apparatus that includes a light emitter, and a package member that accommodates the light emitter and includes a recess section having a reflector function to cause light to outgo to the outside.

BACKGROUND OF THE INVENTION

An exemplary thin and plane light-source employed in a liquid crystal display apparatus and the like is shown in FIG. 6(c). Specifically, a light guiding plate 213 is provided on a rear surface of a liquid crystal display member 212, and a surface-mount type light emitting apparatus 200 is provided on a side surface of the light guiding plate 213. In the plane light-source, the light guiding plate 213 and the light emitting apparatus 200 are placed, adjacent to each other, on a mounting surface 214 such that a side surface of the light guiding plate 213 and a light-outgoing surface 207a of the light emitting apparatus 200 are opposite to each other, thereby realizing a thin shape. Light is emitted from the light emitting apparatus 200, enters via the side surface of the light guiding plate 213, and then outgoes from an upper flat surface of the light guiding plate 213.

An exemplary light emitting apparatus 200 employed in the plane light-source is shown in FIGS. 6(a) and 6(b). Specifically, an LED chip (hereinafter, "chip") is accommodated in a package member (hereinafter, "package") that is in rectangular parallelepiped shape and includes a recess section. The light emitting apparatus 200 accommodates a chip 202, and includes a package 201 including a recess section having a reflector function to cause light to outgo to the outside. The recess section opens flatly with respect to a side surface of the light guiding plate 213. The reflector 203 (recess section) includes: a bottom surface on which the chip 202 is to be placed; and a tilted surface that is formed along a periphery of the bottom surface, such that light is emitted parallel to a mounting surface.

A substantially central part of the bottom surface of the recess section is a die-bond area that includes an electrode 204a on which the chip 202 is to be placed. A wire-bond area is provided in the vicinity of the die-bond area, and an electrode 204b is provided in the wire-bond area to supply the chip 202 with electric power. The chip 202 is placed in the die-bond area, connected to the electrode 204b via a wire 205, and sealed with a light-transmitting sealing resin 207 that contains a fluorescent material 206. When excited by light emitted from the chip 202, the fluorescent material 206 emits a light beam having a different waveform. The sealing resin 207 fills the recess section to the vicinity of a top surface of the recess section, thereby forming a light-outgoing surface 207a that is substantially flat, and protecting the chip 202 and the wire 205.

Known Document 1 (Japanese Unexamined Patent Publication No. 2003-249689 (published on Sep. 5, 2003)) teaches a light emitting apparatus that is similar in structure to the above-described light emitting apparatus. In the light emitting apparatus of Known Document 1, the chip is mounted to the die-bond area via a conductive layer, by flip chip bonding. Then, the fluorescent material is applied to the chip. Thereafter, the chip is sealed by a light-transmitting sealing resin. The light-transmitting sealing resin includes diffusion agents that are dispersed in the sealing resin. The diffusion agents reflect and scatter light that is emitted from the chip or the fluorescent material.

When the sealing resin fills the recess section to the vicinity of a top surface of the recess section and then is thermally cured, a smooth and parabolic concave surface is formed, with a deepest portion at its central section. This action is considered to occur because of the following. The thermal curing causes oil absorbency of the diffusion agent to increase, so that a part of components of the resin is absorbed by the diffusion agent. The diffusion agent absorbs the resin at an absorption rate that is higher than a ratio at which the volume of a diffusion layer increases as a consequence of the absorption of the resin. As a result, the volume of the diffusion layer decreases overall.

To increase a luminance of a plane light-source, it is necessary to increase a coupling efficiency, which is a ratio of (i) light that enters a side surface of the light guiding plate to (ii) light from the light emitting apparatus. For this reason, it is preferable to reduce a radiation angle, in a short-axis direction, of the package.

In the light emitting apparatus of Known Document 1, a slight concave surface is formed. This, however, occurs naturally as a result that the diffusion agent absorbs a part of component of the sealing resin during the thermal curing, and therefore does not contribute to improvement in the radiation angle, in a short-axis direction, of the package.

SUMMARY OF THE INVENTION

The present invention is in view of the above problems, and has as an object to provide a light emitting apparatus that is thin and small in a radiation angle, in a short-axis direction, of a package, and high in coupling efficiency with respect to a light guiding plate.

The present invention also has as an object to realize a backlight apparatus including the light emitting apparatus, and an electronic apparatus including the backlight apparatus.

To achieve the above objects, a light emitting apparatus according to the present invention includes: a placement surface that includes an electrode; a light emitter that is placed on the placement surface; and a transparent sealing resin that seals the light emitter, and forms a concave surface that is a light-outgoing surface via which light outgoes, the concave surface facing a surface of the light emitter, from which surface light is emitted, and the light emitter and the electrode being connected via a wire that is curved in such a way that a top section of the curved wire substantially coincides with a deepest section of the concave surface.

Further, to achieve the above objects, a light emitting apparatus according to the present invention is adapted so that the light emitting apparatus includes: a placement surface that includes an electrode; a light emitter that is placed on the placement surface; and a sealing resin that seals the light emitter, and forms a concave surface that is a light-outgoing surface via which light outgoes, the concave surface facing a surface of the light emitter, from which surface light is emitted, and the concave surface having a depth that is equal to or deeper than a half of a width of the light-outgoing surface in a short-axis direction.

With the above structure, it is possible to reduce a radiation angle and increase a luminous intensity in an axial direction. Thus, for example in the case where the light emitting apparatus is employed in a liquid crystal display apparatus, a light emitting apparatus is provided that is high in coupling efficiency with respect to the side surface of the light guiding plate of the liquid crystal display apparatus.

To achieve the above objects, a backlight apparatus according to the present invention includes the light emitting apparatus.

To achieve the above objects, an electronic apparatus according to the present invention includes the backlight apparatus.

Additional objects, features, and strengths of the present invention will be made clear by the description below. Further, the advantages of the present invention will be evident from the following explanation in reference to the drawings.

DESCRIPTION OF THE EMBODIMENTS

Figure 1A:
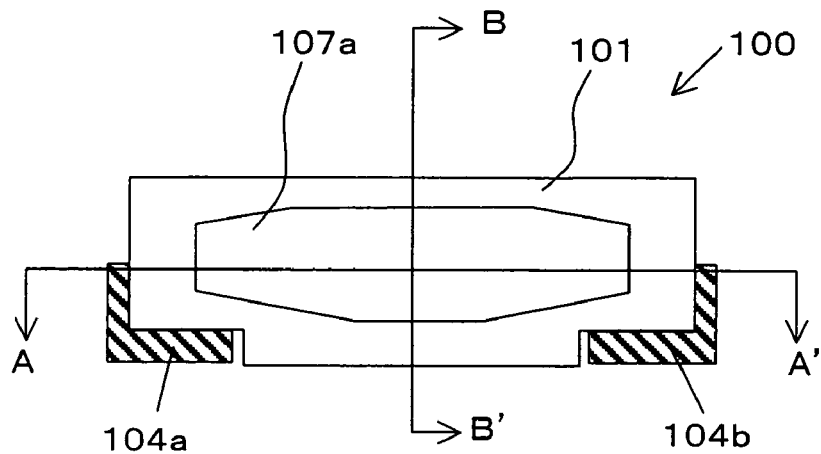
FIG. 1(a) is a front diagram illustrating a light emitting apparatus, taken from a light-outgoing surface thereof, according to an embodiment of the present invention.

The following explains an embodiment of a light emitting apparatus according to the present embodiment, with reference to figures. FIG. 1(a) is a diagram showing a light emitting apparatus 100 of the present embodiment, taken from a light-outgoing surface of the light emitting apparatus 100.

Figure 1B:
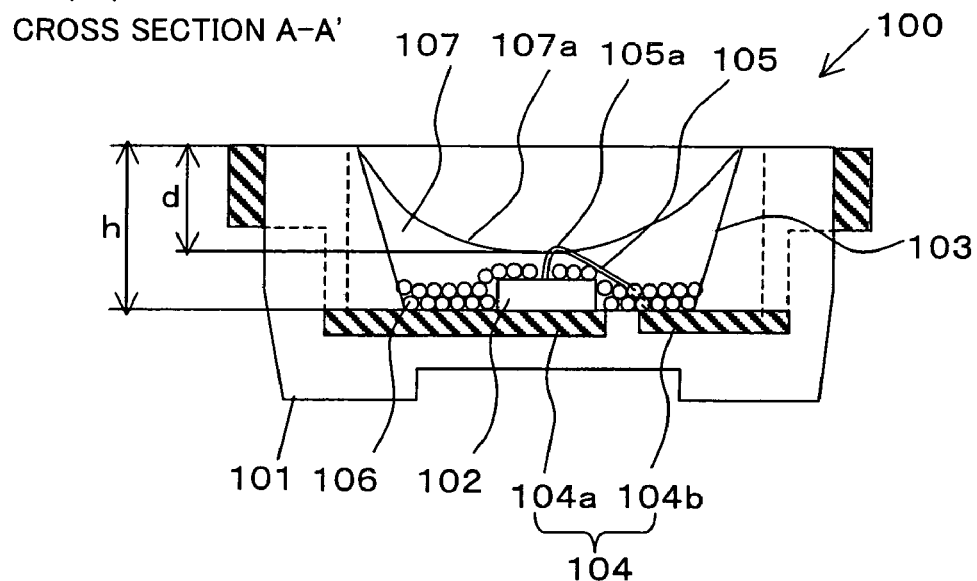
FIG. 1(b) is a cross sectional diagram of the light emitting apparatus in a long-axis direction, according to an embodiment of the present invention.

FIG. 1(b) is a cross sectional diagram (A-A') of the light emitting apparatus 100 in a long-axis direction.

The light emitting apparatus 100 includes: a package 101 that is substantially rectangular parallelepiped, is in bowl-shape, and includes a recess section having a depth of h; and a chip 102 that includes an electrode provided on its top surface that is a light-emitting surface. The recess section forms a reflector 103 that is constituted of a bottom surface (placement surface) and a tilted surface that extends from and along a periphery of the bottom surface. The reflector 103, as described below, may have a function of reflector that is realized by reflectivity of the package 101 colored in white. A reflective layer may be additionally formed on an inner wall of the recess section to increase a reflectivity, whereby the function of reflector is improved. Further, the tilted surface may be a perpendicular surface that has a tilt angle of 90° with respect to the bottom surface.

A pair of electrodes 104 are provided, at a substantially central part and in the vicinity thereof, on the bottom surface of the recess section such that the electrodes 104 are separated from each other. An electrodes 104a, which is one of the electrodes 104, is a die-bond area on which the chip 102 is to be placed. An electrodes 104b, which is the other one of the electrodes 104, is a wire-bond area to which the wire 105 is to be connected. The chip 102 is placed on the die-bond area, and is connected to the electrode 104b via the wire 105 that is curved. Further, a light-transmitting sealing resin 107, which contains a fluorescent material 106, is dropped and thermally cured, thereby sealing the chip 102. A surface of the sealing resin 107 is formed in concave and becomes a light-outgoing surface 107a.

The chip 102 is a light emitting diode that: includes, for example, a light emitting layer mainly containing InGaN, which light emitting layer is laminated on a SiC substrate; emits blue light; and has a dominant wavelength of approximately 452 nm. The fluorescent material 106 emits, when excited by light emitted from the chip 102, a light beam having a wavelength different from that of the light emitted from the chip 102. The fluorescent material 106 is a yellow fluorescent material whose main components are Sr, Ba, Si, O, Eu, and the like. A peak of a wavelength of light emitted from the fluorescent material 106 is 562 nm. Further, the fluorescent material 106 is greater in specific gravity than the sealing resin 107, and sinks into the bottom surface of the recess section during the thermal curing.

The package 101 is formed by insert molding of a polyphenylenamide-based resin. For example, AMODEL (registered trademark) is used suitably. It is preferable that fine particles of titanium oxide be dispersed in the polyphenylenamide-based resin, and the polyphenylenamide-based resin be colored in white.

The sealing resin 107 is made of a modified organic silicon resin that is thermally curable. The sealing resin 107 has a glass transition temperature of 25° C. or higher, preferably 35° C., and a ShoreD, which is a degree of hardness after the hardening, of approximately 70. The sealing resin 107 is suitable for protecting the chip 102 and the wire 105. Further, the sealing resin 107 has a high transmissivity of light in a short wavelength region, and therefore is suitable for sealing the light emitting diode that emits blue light.

The electrodes 104 are made of a metal that is excellent in releasing heat. An alloy of copper and the like is suitably used as the metal. This facilitates releasing heat by the chip 102, so that fluctuation in characteristics, such as a luminous intensity and a wavelength of emitted light, due to increase in temperature of the chip 102 is restrained.

Further, it is preferable that a surface of the electrodes 104 be processed such that the reflectivity is increased. For example, it is preferable that the surface be plated with silver. This allows light to be reflected more efficiently on the surface of the electrodes 104.

Figure 1C:
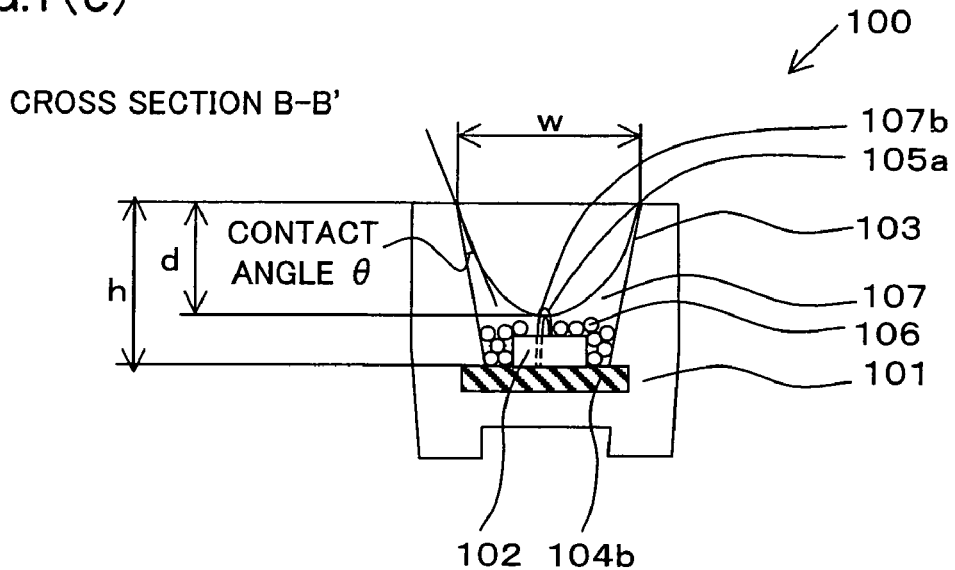
FIG. 1(c) is a cross sectional diagram of the light emitting apparatus in a short-axis direction, according to an embodiment of the present invention.

FIG. 1(*c*) is a cross sectional diagram (B-B') in a short-axis direction. According to FIG. 1(*c*), when dropped at a substantially central part of the recess section, the sealing resin 107 slopes upward, along the tilted surface of the reflector 103, to a periphery section of the recess section. Consequently, a light-outgoing surface 107*a*, which is a smooth concave surface with a deepest portion at its central section, is formed. The light-outgoing surface 107*a* has a concavity of d at the deepest section 107*b* in the aperture section. It is considered that the sealing resin 107 slopes upward due to surface tension between the sealing resin 107 and the package 101.

When liquid is dropped on a surface of solid, the liquid rises upward from the surface of the solid at an interface of the solid and the liquid, and forms an angle. The angle thus formed is called a contact angle. When liquid covers a surface of solid such that the bottom of the liquid stretches, it is considered that wettability is good. In other words, when a contact angle is small, it is considered that wettability is good. A surface tension between solid and liquid is an exemplary factor to decide the contact angle. A lower surface tension allows the contact angle to become narrower. In other words, the wettability becomes improved.

In FIG. 1(*c*), fine particles of titanium oxide is dispersed in a resin that constitutes the package 101, and the surface tension between the sealing resin 107 and the package 101 is low. Thus, the wettability is good. Therefore, the sealing resin 107 is allowed to slope upward along the tilted surface of the reflector 103 to cover the surface, thereby easily forming a deep concave surface. This makes it possible to increase a mechanical intensity of the tilted surface of the reflector 103, and therefore the light emitting apparatus 100 is restrained from changing in shape when mounted.

The amount of the sealing resin 107 to be dropped is decided such that, as shown in FIG. 1(*b*) or 1(*c*), a top section 105*a* of the curve formed by the wire substantially coincides with the deepest section 107*b* of the light-outgoing surface 107*a*.

In this case, it is easily determined whether the amount of dropped sealing resin 107 is large or small by visually observing whether or not the top section 105*a* protrudes from the deepest section 107*b*. This facilitates managing the amount of the sealing resin 107 to be dropped. Note that the top section 105*a* of the curve formed by the wire may protrude from the deepest section 107*b* of the light-outgoing surface 107*a*.

Figure 2:
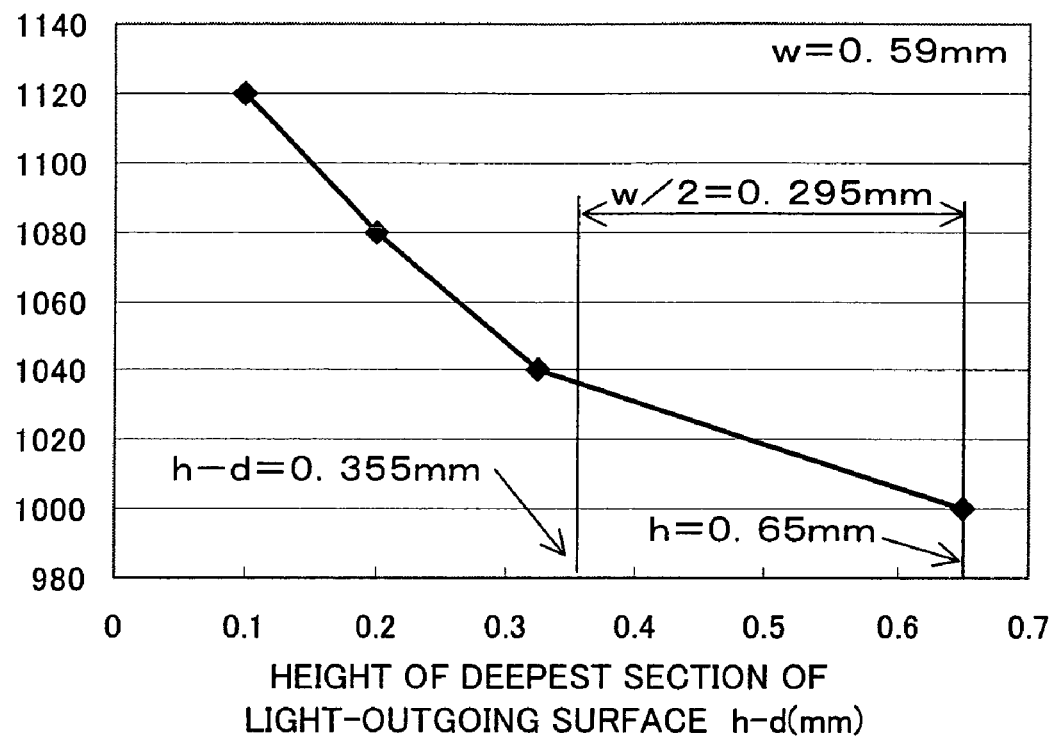
FIG. 2 is a diagram showing a relationship between (i) a height, from a bottom surface of a recess section of a package, of a deepest section of a sealing resin and (ii) a luminous intensity in an axial direction, in a light emitting apparatus according to an embodiment of the present invention.
Figure 3A:
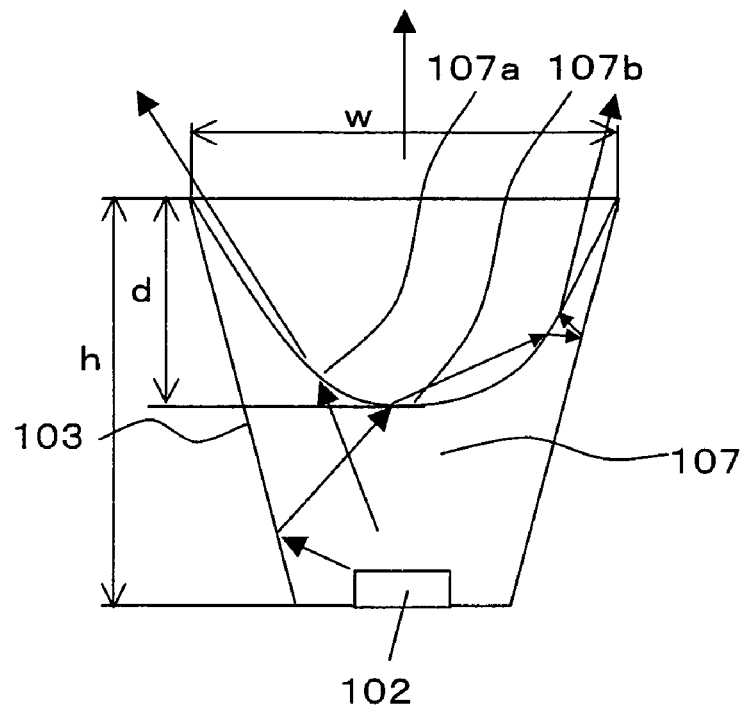
FIG. 3(a) is a diagram showing optical paths in a light emitting apparatus of an embodiment of the present invention.
Figure 3B:
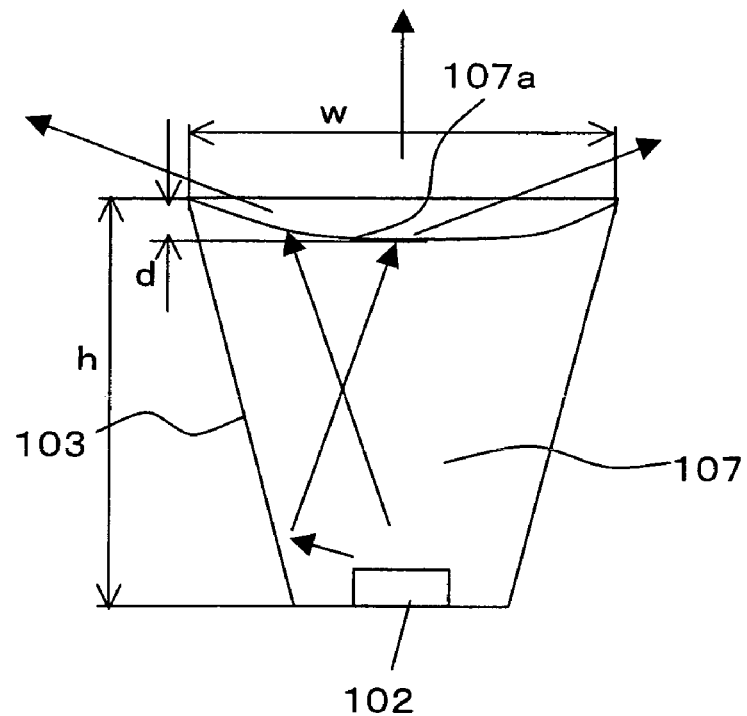
FIG. 3(b) is a diagram showing optical paths in a conventional light emitting apparatus of an embodiment of the present invention.

FIG. 2 is a diagram showing a relationship between (A) a height (h−d) of the deepest section 107*b* of the light-outgoing surface 107*a* when the light-outgoing surface 107*a* is viewed from the bottom surface of the recess section of the package 101 and (B) luminous intensity in an axial direction. FIG. 3 is a diagram showing optical paths in a short-axis direction in the package 101. According to FIG. 2, the lower the height (h−d) of the deepest section 107*b* is, the greater the luminous intensity in an axial direction becomes. In other words, the deeper the concavity d from the aperture section is, the greater the luminous intensity in an axial direction becomes.

This is considered to occur because of the following. As shown in FIG. 3(*a*), light that is emitted at a small elevation angle with respect to the light-outgoing surface 107*a*, which light is a part of light that passes through the light-outgoing surface 107*a*, is caught by the reflector 103 and reflected toward the light-outgoing surface 107*a*. The greater the concavity d from the aperture section is, the more the components of light are caught by the reflector 103.

FIG. 3(*b*) is a diagram showing optical paths in a conventional light emitting apparatus. The figure is shown for the purpose of comparison. In the conventional light emitting apparatus, when emitted at a small elevation angle with respect to the light-outgoing surface 107*a*, light is scattered in all directions on the light-outgoing surface 107*a*. As such, the deeper the concavity d from the aperture section is formed, the higher the luminous intensity in an axial direction becomes.

For example, a light emitting apparatus 100 is manufactured with: a package 101 that has a recess section whose depth h is 0.65 mm and a light-outgoing surface whose width w in a short-axis direction is 0.59 mm; and a chip 102 whose thickness is 0.115 mm. A height of the curve formed by the wire from the top surface of the chip 102 is approximately 0.2 mm to 0.26 mm. A height of the top section 105*a* of the curve formed by the wire from the bottom surface of the recess section is approximately 0.315 mm to 0.375 mm. This dimension corresponds to 48% to 58% of the depth h, which is equal to 0.65 mm, of the recess section. In other words, a deepest possible concavity d from the aperture section is formed, at least in the present embodiment, by filling the sealing resin 107 in such a way that either the sealing resin 107 covers the surface of the chip 102 and substantially coincides with a height of the top section 105*a* of the curve formed by the wire, or the top section 105*a* slightly protrudes.

In the present embodiment, the sealing resin 107 was filled to approximately 50% of the depth h of the recess section. As a result, a light-outgoing surface 107*a* was formed such that the contact angle θ was approximately 20°, and the tilted surface of the reflector 103 was almost entirely covered by a smooth concave surface. In this case, an advantage was produced that a luminous intensity in an axial direction increased by approximately 4%, compared to the case in which the concavity d from the aperture section was zero. In the light emitting apparatus of Known Document 1, the location of the deepest section 107*a* from the bottom surface of the recess section is merely 90% of the depth h of the recess section, and thus the luminous intensity in an axial direction is not that high.

Note that, in FIG. 2, the height (h−d) of the deepest section 107*b*, which height corresponds to w/2, is 0.355 mm because w=0.59 mm in the present embodiment.

According to FIG. 2, when the concavity d from the aperture section becomes deeper than a half of the width w, in a short-axis direction, of the light-outgoing surface 107*a* in FIG. 1(*c*), the luminous intensity in an axial direction increases suddenly and rapidly. Therefore, it is preferable that the concavity d from the aperture section is equal to or deeper than a half of the width w, in a short-axis direction, of the light-outgoing surface 107*a*.

Figure 4A:
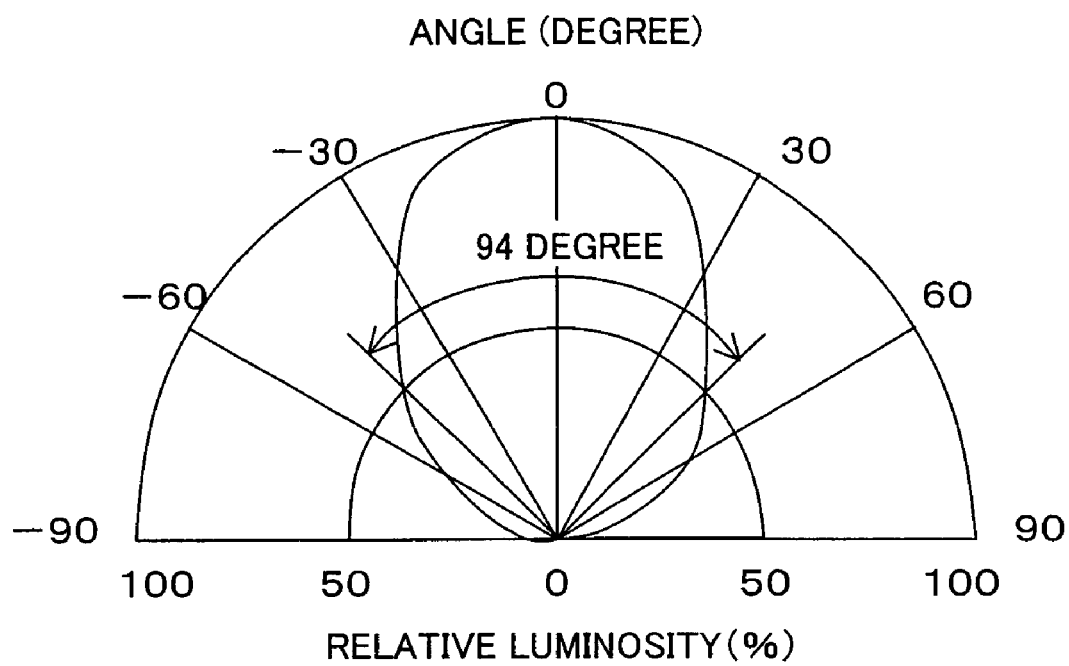
FIG. 4(a) is a diagram showing characteristics of a radiation angle in a short-axis direction, in a package according to an embodiment of the present invention.
Figure 4B:
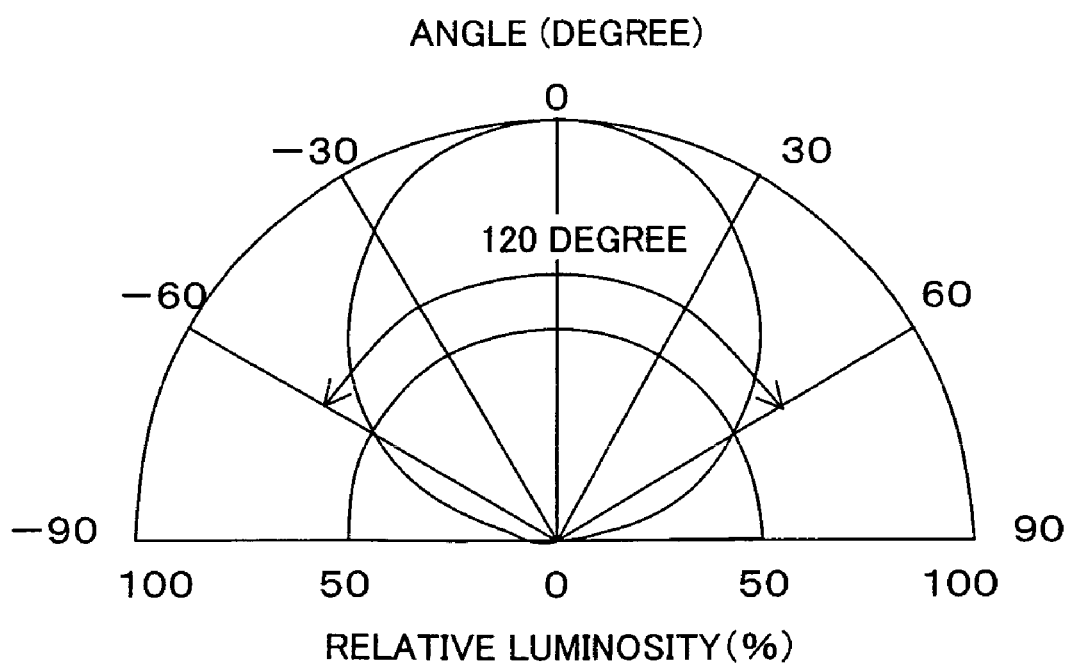
FIG. 4(b) is a diagram showing characteristics of a radiation angle in a short-axis direction, in a package according to a conventional light emitting apparatus.

FIG. 4 is a diagram showing characteristics of the radiation angle in a short-axis direction in the package 101. As shown in FIG. 4(*a*), a characteristic of the radiation angle in the present embodiment is that a half radiation angle is approximately 94°. Thus, the radiation angle in the present embodiment is smaller than the radiation angle, which is approximately 120° as shown in FIG. 4(*b*), in the conventional light emitting apparatus.

Figure 5:
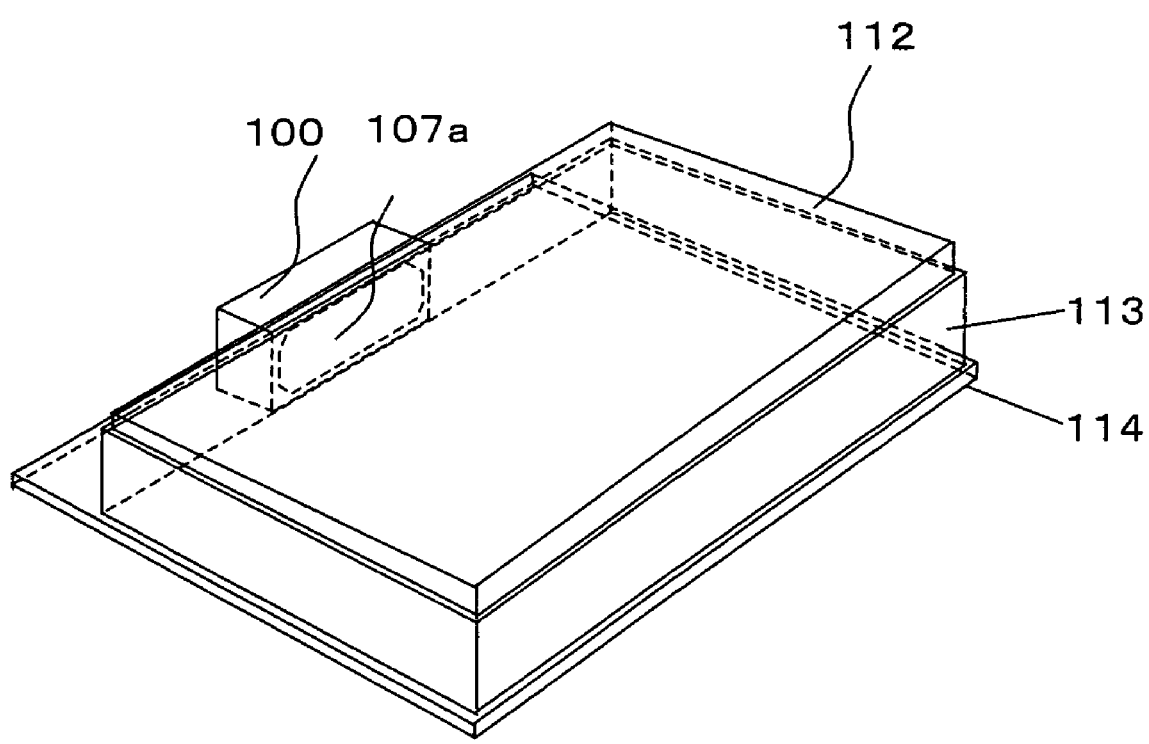
FIG. 5 is a perspective view showing an exemplary liquid crystal display apparatus that includes a light emitting apparatus of an embodiment of the present invention.
Figure 6A:
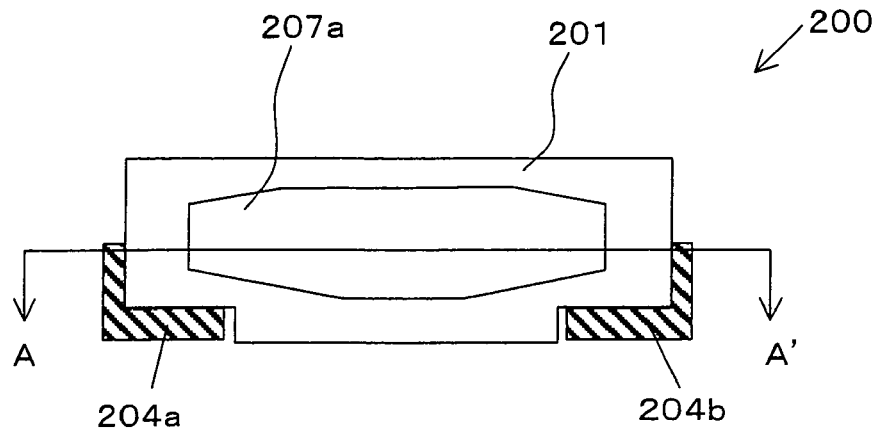
FIG. 6(a) is a front diagram of a conventional light emitting apparatus, taken from a light-outgoing surface.
Figure 6B:
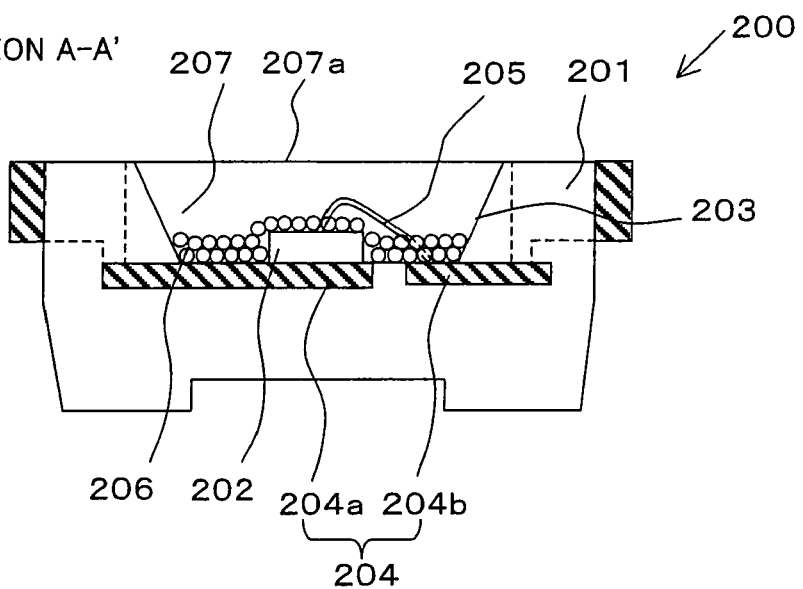
FIG. 6(b) is a cross sectional diagram of a conventional light emitting apparatus, taken in a long-axis direction.
Figure 6C:
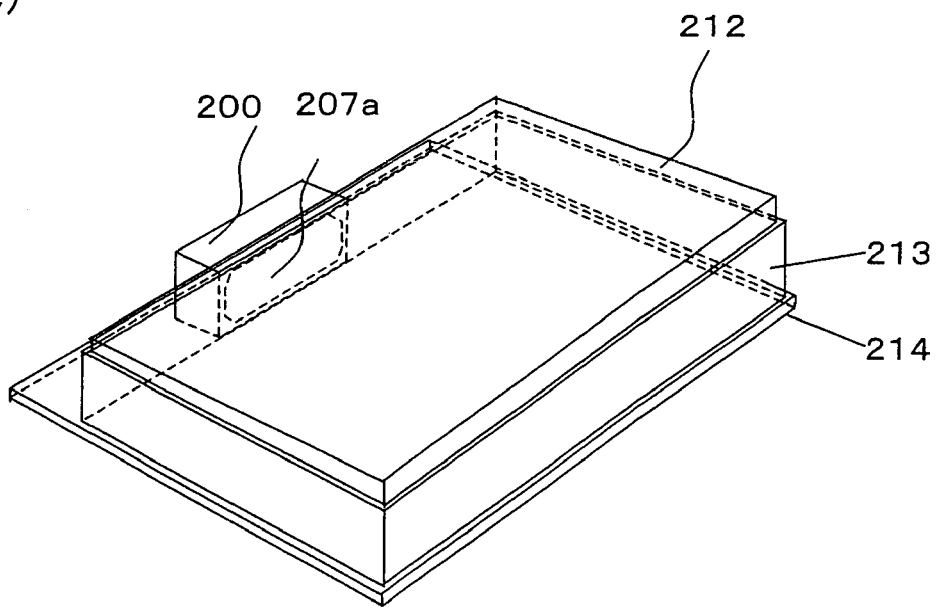
FIG. 6(c) is a perspective view showing an exemplary liquid crystal display apparatus that includes a conventional light emitting apparatus.

FIG. 5 is a diagram showing an exemplary liquid crystal display apparatus that includes a light emitting apparatus of the present embodiment. The liquid crystal display apparatus includes: a liquid crystal display member 112; a light guiding plate 113 that is provided on a rear surface of the liquid crystal display member 112; and a light emitting apparatus 100 that is provided on a side surface of the light guiding plate 113. the light guiding plate 113 and the light emitting apparatus 100 are placed, adjacent to each other, on a mounting surface 114 such that a side surface of the light guiding plate 113 and a light-outgoing surface 107a of the light emitting apparatus 100 are opposite to each other, thereby realizing a thin shape. After emitted from the light emitting apparatus 100, light enters a side surface of the light guiding plate 113 and then outgoes from an upper surface of the light guiding plate 113 to illuminate a rear surface of the liquid crystal display member 112. A radiation angle of light that is emitted from the light emitting apparatus 100 is narrow, so that a coupling efficiency of light is high with respect to the side surface of the light guiding plate 113. This allows the light to efficiently enter the light guiding plate 113. Note that the light guiding plate 113 and the light emitting apparatus 100 constitute a backlight apparatus.

Figure 7:
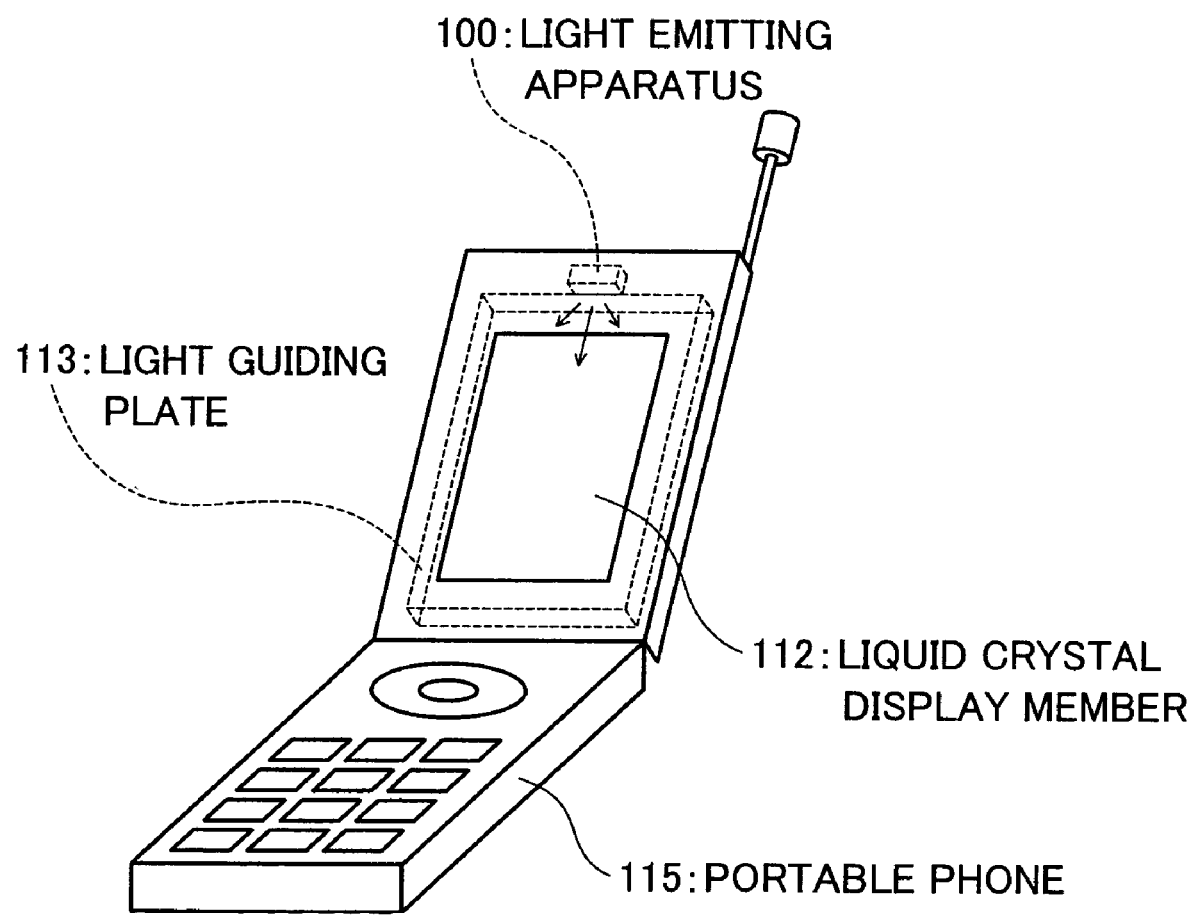
FIG. 7 is a perspective view showing an exemplary electronic apparatus that includes a liquid crystal display apparatus of an embodiment of the present invention.

In this case, it is not necessary to place, between the side surface of the light guiding plate 113 and the light-outgoing surface 107a, an intermediary optical device, such as a convex lens, to converge light to the side surface of the light guiding plate 113. This allows the light emitting apparatus 100 to be mounted compactly. It is preferable that the mounting surface 114, which is opposite to a rear surface of the light guiding plate 113, be processed so as to be reflective. In this case, light that is emitted from the rear surface of the light guiding plate 113 is reflected by the surface of the mounting surface 114 and then illuminates the rear surface of the liquid crystal display member 112. This makes it possible to increase a luminance of a display surface. Installation of such liquid crystal display apparatus in, for example, a portable phone 115 (exemplary electronic apparatus) as shown in FIG. 7 allows the portable phone 115 to be compact in size and high in luminance of the display section.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

It is preferable that the concave surface have a depth that is equal to or greater than a half of a width of the light-outgoing surface in a short-axis direction.

Further, it is preferable that a light emitting apparatus include a package member that includes a recess section whose bottom surface constitutes the placement surface, the recess section including the placement surface and a tilted surface that extends from and along a periphery of the placement surface, the light emitter being sealed with the sealing resin, and the sealing resin sloping upward along the tilted surface.

Further, it is preferable that a periphery of the light-outgoing surface substantially coincide with a periphery of the recess section.

Further, it is preferable that the package member be made of a polyphenylenamide-based resin.

Further, it is preferable that the package member be made of a polyphenylenamide-based resin in which a titanium oxide is dispersed.

Further, it is preferable that the sealing resin be a modified organic silicon resin that is thermally curable, and that have a glass transition temperature of 25° C. or higher.

Further, it is preferable that the electrode be made of an alloy of copper.

Further, it is preferable that a surface of the electrode be plated with silver.

Further, it is preferable that the sealing resin contain a fluorescent material, and that the fluorescent material emit, when excited by the light emitted from the light emitter, a light beam having a wavelength different from that of the light emitted from the light emitter.

Further, it is preferable that the light emitter be a light emitting diode that emits blue light, and the fluorescent material emit yellow light when excited by the blue light.

The present invention is not limited to the description of the embodiments above, but may be altered by a skilled person within the scope of the claims. An embodiment based on a proper combination of technical means disclosed in different embodiments is encompassed in the technical scope of the present invention.

What is claimed is:

1. A light emitting apparatus, comprising:
   a placement surface that includes an electrode;
   a light emitter that is placed on the placement surface; and
   a transparent sealing resin that seals the light emitter, and forms a concave surface that is a light-outgoing surface via which light outgoes,
   the concave surface facing a surface of the light emitter, from which surface light is emitted, and
   the light emitter and the electrode being connected via a wire that is curved in such a way that a top section of the curved wire substantially coincides with a deepest section of the concave surface.

2. The apparatus according to claim 1, wherein the concave surface has a depth that is equal to or greater than a half of a width of the light-outgoing surface in a short-axis direction.

3. The apparatus according to claim 1, comprising:
   a package member that includes a recess section whose bottom surface constitutes the placement surface,
   the recess section including the placement surface and a tilted surface that extends from and along a periphery of the placement surface,
   the light emitter being sealed with the sealing resin, and
   the sealing resin sloping upward along the tilted surface.

4. The apparatus according to claim 3, wherein the package member is made of a polyphenylenamide-based resin in which a titanium oxide is dispersed.

5. A light emitting apparatus, comprising:
   a placement surface that includes an electrode;
   a light emitter that is placed on the placement surface; and
   a transparent sealing resin that seals the light emitter, and forms a concave surface that is a light-outgoing surface via which light outgoes,
   the concave surface facing a surface of the light emitter, from which surface light is emitted, and
   the concave surface has a depth that is equal to or greater than a half of a width of the light-outgoing surface in a short-axis direction.

6. The apparatus according to claim 5, comprising:
   a package member that includes a recess section whose bottom surface constitutes the placement surface,
   the recess section including the placement surface and a tilted surface that extends from and along a periphery of the placement surface,
   the light emitter being sealed with the sealing resin, and
   the sealing resin sloping upward along the tilted surface.

7. The apparatus according to claim 6, wherein a periphery of the light-outgoing surface substantially coincides with a periphery of the recess section.

8. The apparatus according to claim 6, wherein the package member is made of a polyphenylenamide-based resin.

9. The apparatus according to claim 6, wherein the package member is made of a polyphenylenamide-based resin in which a titanium oxide is dispersed.

10. The apparatus according to claim 5, wherein the sealing resin (i) is a modified organic silicon resin that is thermally curable and (ii) has a glass transition temperature of 25° C. or higher.

11. The apparatus according to claim 5, wherein the electrode is made of an alloy of copper.

12. The apparatus according to claim 5, wherein a surface of the electrode is plated with silver.

13. The apparatus according to claim 5, wherein:
the sealing resin contains a fluorescent material; and
the fluorescent material emits, when excited by the light emitted from the light emitter, a light beam having a wavelength different from that of the light emitted from the light emitter.

14. The apparatus according to claim 13, wherein:
the light emitter is a light emitting diode that emits blue light; and
the fluorescent material emits yellow light when excited by the blue light.

15. A backlight apparatus comprising:
a light emitting apparatus that includes:
a placement surface that includes an electrode;
a light emitter that is placed on the placement surface; and
a transparent sealing resin that seals the light emitter, and forms a concave surface that is a light-outgoing surface via which light outgoes,
the concave surface facing a surface of the light emitter, from which surface light is emitted, and
the light emitter and the electrode in the light emitting apparatus being connected via a wire that is curved in such a way that a top section of the curved wire substantially coincides with a deepest section of the concave surface.

16. A backlight apparatus comprising:
a light emitting apparatus that includes:
a placement surface that includes an electrode;
a light emitter that is placed on the placement surface; and
a transparent sealing resin that seals the light emitter, and forms a concave surface that is a light-outgoing surface via which light outgoes,
the concave surface facing a surface of the light emitter, from which surface light is emitted, and
the concave surface of the light emitting apparatus has a depth that is equal to or greater than a half of a width of the light-outgoing surface in a short-axis direction.

17. An electronic apparatus comprising:
a backlight apparatus including a light emitting apparatus that includes:
a placement surface that includes an electrode;
a light emitter that is placed on the placement surface; and
a transparent sealing resin that seals the light emitter, and forms a concave surface that is a light-outgoing surface via which light outgoes,
the concave surface facing a surface of the light emitter, from which surface light is emitted, and
the light emitter and the electrode in the light emitting apparatus being connected via a wire that is curved in such a way that a top section of the curved wire substantially coincides with a deepest section of the concave surface.

18. An electronic apparatus comprising:
a backlight apparatus including a light emitting apparatus that includes:
a placement surface that includes an electrode;
a light emitter that is placed on the placement surface; and
a transparent sealing resin that seals the light emitter, and forms a concave surface that is a light-outgoing surface via which light outgoes,
the concave surface facing a surface of the light emitter, from which surface light is emitted, and
the concave surface of the light emitting apparatus has a depth that is equal to or greater than a half of a width of the light-outgoing surface in a short-axis direction.

* * * * *